(12) United States Patent
Brookhyser et al.

(10) Patent No.: US 11,705,686 B2
(45) Date of Patent: Jul. 18, 2023

(54) ACOUSTO-OPTIC SYSTEM HAVING PHASE-SHIFTING REFLECTOR

(71) Applicant: ELECTRO SCIENTIFIC INDUSTRIES, INC., Portland, OR (US)

(72) Inventors: James Brookhyser, Portland, OR (US); Jan Kleinert, Portland, OR (US); Jered Richter, Portland, OR (US); Kurt Eaton, Portland, OR (US)

(73) Assignee: ELECTRO SCIENTIFIC INDUSTRIES, INC., Beaverton, OR (US)

( * ) Notice: Subject to any disclaimer, the term of this patent is extended or adjusted under 35 U.S.C. 154(b) by 500 days.

(21) Appl. No.: 16/636,605

(22) PCT Filed: Sep. 20, 2018

(86) PCT No.: PCT/US2018/052018
§ 371 (c)(1),
(2) Date: Feb. 4, 2020

(87) PCT Pub. No.: WO2019/060590
PCT Pub. Date: Mar. 28, 2019

(65) Prior Publication Data
US 2021/0226406 A1    Jul. 22, 2021

Related U.S. Application Data

(60) Provisional application No. 62/562,047, filed on Sep. 22, 2017.

(51) Int. Cl.
*H01S 3/106* (2006.01)
*G02F 1/33* (2006.01)
(Continued)

(52) U.S. Cl.
CPC .............. *H01S 3/1068* (2013.01); *G02B 6/42* (2013.01); *G02B 26/06* (2013.01); *G02F 1/00* (2013.01);
(Continued)

(58) Field of Classification Search
CPC .......... G02B 6/42; G02B 26/06; G02B 21/00; G02B 21/002; G02B 21/0036;
(Continued)

(56) References Cited

U.S. PATENT DOCUMENTS 3,655,255 A * 4/1972 Krause .................... H03H 9/36
501/40
3,671,103 A * 6/1972 Uchida et al. ............ G02F 1/33
359/305

(Continued)

FOREIGN PATENT DOCUMENTS

| CN | 101738815 B | 5/2012 |
|----|----|----|
| JP | 1994082851 A | 3/1994 |

(Continued)

OTHER PUBLICATIONS

The Chinese Office Action issued for Chinese counterpart application No. 201880055941.1, dated Jan. 14, 2022 (12 pages).
The PCT/US2018/052018, international search report dated Jan. 23, 2019, 2 pages.
The PCT/US2018/052018, written opinion, 5 pages.
(Continued)

*Primary Examiner* — Jie Lei
(74) *Attorney, Agent, or Firm* — Kurt M. Eaton

(57) ABSTRACT

A beam positioner can be broadly characterized as including a first acousto-optic (AO) deflector (AOD) operative to diffract an incident beam of linearly polarized laser light, wherein the first AOD has a first diffraction axis and wherein the first AOD is oriented such that the first diffraction axis has a predetermined spatial relationship with the plane of
(Continued)

polarization of the linearly polarized laser light. The beam positioner can include at least one phase-shifting reflector arranged within a beam path along which light is propagatable from the first AOD. The at least one phase-shifting reflector can be configured and oriented to rotate the plane of polarization of light diffracted by the first AOD.

18 Claims, 4 Drawing Sheets

(51) Int. Cl.
*G02F 1/29* (2006.01)
*G02B 6/42* (2006.01)
*G02F 1/00* (2006.01)
*H01S 5/12* (2021.01)
*H01S 5/14* (2006.01)
*G02B 26/06* (2006.01)

(52) U.S. Cl.
CPC ............... *G02F 1/292* (2013.01); *G02F 1/33* (2013.01); *H01S 5/124* (2013.01); *H01S 5/145* (2013.01)

(58) Field of Classification Search
CPC ............ G02B 21/0092; G02B 21/0076; G02B 27/09; G02F 1/00; G02F 1/29; G02F 1/292; G02F 1/11; G02F 1/33; G02F 1/332; G02F 1/335; G02F 1/3134; G02F 2201/16; G02F 2203/24; H01S 3/106; H01S 3/1068; H01S 3/117; H01S 5/124; H01S 5/145
USPC ........ 359/310–312, 285–287, 305, 314, 321, 359/238, 245, 278; 372/9, 10, 13, 21
See application file for complete search history.

(56) References Cited

U.S. PATENT DOCUMENTS

| | | | |
|---|---|---|---|
| 5,637,243 A | 6/1997 | Sato et al. | |
| 7,279,721 B2 | 10/2007 | Jennings et al. | |
| 7,355,722 B2 | 4/2008 | Hill | |
| 7,667,888 B2 | 2/2010 | Wasilousky | |
| 8,339,574 B2 | 12/2012 | Totzeck et al. | |
| 9,036,247 B2 | 5/2015 | Cordingley et al. | |
| 2002/0136524 A1 | 9/2002 | Agha Riza | |
| 2004/0179558 A1 | 9/2004 | Seguin et al. | |
| 2005/0270630 A1* | 12/2005 | Johnson | H01S 3/117 359/305 |
| 2012/0044569 A1 | 2/2012 | Maak et al. | |
| 2013/0010349 A1* | 1/2013 | Cordingley | G02F 1/33 359/305 |
| 2015/0338718 A1 | 11/2015 | Zhang et al. | |

FOREIGN PATENT DOCUMENTS

| | | | |
|---|---|---|---|
| JP | 2002160086 A | 6/2002 |
| JP | 33253548 B2 | 9/2002 |
| JP | 2003329956 A | 11/2003 |
| JP | 2006053438 A | 2/2006 |
| JP | 2012253092 A | 12/2012 |
| JP | 2013172100 A | 9/2013 |
| WO | 2006113100 A1 | 10/2006 |

OTHER PUBLICATIONS

The Office Action for Japanese counterpart application No. 2020-515659 dated Aug. 26, 2022 (7 pages).
Office Action for Japanese counterpart application No. 2020-515659 dated Jan. 31, 2023 (5 pages).
Office Action Report for Taiwanese counterpart application No. 111134346 dated Feb. 3, 2023 (11 pages).
Office Action for Korean counterpart application No. 10-2020-7006324 dated Apr. 24, 2023 (3 pages).

* cited by examiner

ACOUSTO-OPTIC SYSTEM HAVING PHASE-SHIFTING REFLECTOR

CROSS-REFERENCE TO RELATED APPLICATIONS

This application claims the benefit of U.S. Provisional Application No. 62/562,047, filed Sep. 22, 2017, which is incorporated by reference in its entirety.

BACKGROUND

Acousto-optic (AO) devices, sometimes referred to as Bragg cells, diffract and shift light using acoustic waves at radio frequency. These devices are often used for Q-switching, signal modulation in telecommunications systems, laser scanning and beam intensity control in microscopy systems, frequency shifting, wavelength filtering in spectroscopy systems. Many other applications lend themselves to using acousto-optic devices. For example, AO deflectors (AODs) can be used in laser-based materials processing systems.

In a typical AO device, a transducer is attached to an AO medium (also referred to as an "AO cell"), typically a crystal or glass that is suitably transparent to the wavelength of light to be diffracted. An RF signal (also known as a "drive signal") is applied to the transducer (e.g., from an RF driver), thereby driving the transducer to vibrate at a certain frequency to create an acoustic wave that propagates in the AO medium, manifested as periodic regions of expansion and compression in the AO medium, thereby creating a periodically changing refractive index within the AO medium. The periodically changing refractive index functions like an optical grating that can diffract a beam of laser light propagating through the AO medium.

Referring to FIG. 1, an AOD 100 generally includes AO medium 102, a transducer 104 attached to the AO medium 102 (i.e., at a transducer end of the AO medium 102) and, can also include an acoustic absorber 106 attached to the AO medium 102 (i.e., at an absorber end of the AO medium 102, opposite the transducer end). An RF driver 108 is usually electrically coupled to an input of the transducer 104 to drive the AOD 100. The material from which the AO medium 102 is formed is selected depending on the wavelength of light in the beam of laser light to be deflected. The transducer 104 is generally a piezoelectric transducer, and is operative to vibrate in response to an input RF signal (i.e., drive signal) output by the RF driver 108. The RF driver 108 is operative to generate the drive signal that is ultimately input to the transducer 104.

Generally, the transducer 104 is attached to the AO medium 102 such that vibrations generated by the transducer 104 can create a corresponding acoustic wave (e.g., as indicated by lines 112) that propagates within the AO medium 102, from the transducer end toward the acoustic absorber 106 along the diffraction axis 110 of the AOD 100. As exemplarily illustrated in FIG. 1, when a drive signal (e.g., characterized by a frequency, amplitude, phase, etc.) is applied to the transducer 104, the transducer 104 vibrates to create an acoustic wave propagating within the AO medium 102, thereby generating a periodically changing refractive index within the AO medium 102. As is known in the art, the periodically changing refractive index functions to diffract a beam of laser light (e.g., propagating along beam path 114) that is incident upon a first surface 102a of the AO medium 102 and propagates through the AO medium 102 at the Bragg angle, $\theta_B$, measured relative to the acoustic wave.

Diffracting the incident beam of laser light produces a diffraction pattern that typically includes zeroth- and first-order diffraction peaks, and may also include higher-order diffraction peaks (e.g., second-order, third-order, etc.). As is known in the art, the portion of the diffracted beam of laser light in the zeroth-order diffraction peak is referred to as a "zeroth-order" beam, the portion of the diffracted beam of laser light in the first-order diffraction peak is referred to as a "first-order" beam, and so on. Generally, the zeroth-order beam and other diffracted-order beams (e.g., the first-order beam, etc.) propagate along different beam paths upon exiting the AO medium 102 (e.g., through a second surface 102b of the AO medium 102, opposite the first surface 102a). For example, the zeroth-order beam propagates along a zeroth-order beam path, the first-order beam propagates along a first-order beam path, and so on. The angles between the zeroth- and other diffracted-order beam paths (e.g., the angle, $\theta_D$, between the zeroth- and first-order beam paths) corresponds to the frequency (or frequencies) in the drive signal that was applied to diffract the beam of laser light incident upon the AO medium 102.

The amplitude of the applied drive signal can have a non-linear effect on the proportion of the incident beam of laser light that gets diffracted into the various diffracted-order beams, and an AOD can be driven to diffract a significant portion of an incident beam of laser light into the first-order beam, leaving a relatively small portion of the incident beam of laser light to remain in other diffracted-order beams (e.g., the zeroth-order beam, etc.). Moreover, the frequency of the applied drive signal can be rapidly changed to scan first-order beam (e.g., to facilitate processing of different regions of a workpiece). Thus AODs are advantageously incorporated into laser processing systems for use within the field of laser-based materials processing, to variably deflect the first-order beam onto a workpiece during processing (e.g., melting, vaporizing, ablating, marking, cracking, etc.) of the workpiece.

Laser processing systems typically include one or more beam dumps to prevent laser light propagating along the zeroth-order beam path (and any higher-order beam paths) from reaching the workpiece. Accordingly, within a laser processing system, the first-order beam path exiting the AOD 100 can typically be regarded as the beam path 114 that has been rotated or deflected (e.g., by angle, $\theta_D$, also referred to herein as "first-order deflection angle") within the AOD 100. The axis about which the beam path 114 is rotated (also referred to herein as the "rotation axis") is orthogonal to the diffraction axis of the AOD 100 and an axis along which the incident beam of laser light propagates (also referred to herein as the "optical axis") within the AOD 100 when the AOD 100 is driven to diffract the incident beam of laser light. The AOD 100 thus deflects an incident beam path 114 within a plane (also referred to herein as a "plane of deflection") that contains (or is otherwise generally parallel to) the diffraction axis of the AOD 100 and the optical axis within the AOD 100. The spatial extent across which the AOD 100 can deflect the beam path 114 within the plane of deflection is herein referred to as the "scan field" of the AOD 100.

Laser processing systems can incorporate multiple AODs, arranged in series, to deflect the beam path 114 along two axes. For example, and with reference to FIG. 2, a first AOD 200 and a second AOD 202 can be oriented such that their respective diffraction axes (i.e., a first diffraction axis 200a and a second diffraction axis 202a, respectively) are oriented perpendicular to one another. In this example, the first AOD 200 is operative to rotate the beam path 114 about a first rotation axis 200b (e.g., which is orthogonal to the first diffraction axis 200a), thus deflecting the incident beam path 114 within a first plane of deflection (i.e., a plane that contains, or is otherwise generally parallel to, the first diffraction axis 200a and the optical axis within the first AOD 200), wherein the first plane of deflection is orthogonal to the first rotation axis 200b. Likewise, the second AOD 202 is operative to rotate the beam path 114 about a second rotation axis 202b (e.g., which is orthogonal to the second diffraction axis 202a), thus deflecting the incident beam path 114 within a second plane of deflection (i.e., a plane that contains, or is otherwise generally parallel to, the second diffraction axis 202a and the optical axis within the second AOD 202), wherein the second plane of deflection is orthogonal to the second rotation axis 202b. In view of the above, the first and second AODs 200 and 202 can be collectively characterized as a multi-axis "beam positioner," and each can be selectively operated to deflect the beam path 114 within a two-dimensional scan field 204. As will be appreciated, the two-dimensional range scan field 204 can be considered to be a superposition of two one-dimensional scan fields: a first, one-dimensional scan field associated with the first AOD 200 and a second, one-dimensional scan field associated with the second AOD 202.

Depending on the type of AODs included in the multi-axis beam positioner, it can be desirable to rotate the plane of polarization of light (i.e., the plane in which the electric field oscillates) in the first-order beam path transmitted by the first AOD 200. Rotating the plane of polarization will be desired if the amount of RF drive power required to diffract significant portion of an incident beam of laser light into the first-order beam is highly dependent on the polarization state of the beam of laser light being deflected. Further, if each AOD in the multi-axis beam positioner includes an AO medium 102 formed of the same material, and if each AOD uses the same type of acoustic wave to deflect an incident beam of laser light, and if it is desirable to have the polarization state of light in the first-order beam transmitted by the first AOD 200 be linear and be oriented in a particular direction relative to the second diffraction axis 202a, then it would be similarly desirable to have the polarization state of light in the first-order beam transmitted by the second AOD 202 be rotated with respect to the polarization state of the light in the first-order beam transmitted by the first AOD 200 just as the orientation of the second AOD 202 is rotated with respect to an orientation of the first AOD 200.

Conventionally, the polarization rotation is provided by a half-wave plate, and the orientation of polarization after the half-wave plate relative to the incident beam of laser light is a function of the orientation of the half-wave plate relative to the polarization orientation of the incident beam of laser light. Half-wave plates are typically manufactured from materials that exhibit sufficient birefringence, and which are suitably transparent to a particular wavelength (or range of wavelengths) of light to be phase-shifted. Conventional half-wave plates designed to phase-shift light at wavelengths in a range from 9 µm (or thereabout) 11 µm (or thereabout) (e.g., 9.2 µm, 9.5 µm, 10.6 µm, etc.) are undesirably expensive, and typically are not suitable for high power laser applications such as laser-based materials processing with a $CO_2$ laser.

SUMMARY

One embodiment can be broadly characterized as a beam positioner that includes a first acousto-optic (AO) deflector (AOD) operative to diffract an incident beam of linearly polarized laser light, wherein the first AOD has a first diffraction axis and wherein the first AOD is oriented such that the first diffraction axis has a predetermined spatial relationship with the plane of polarization of the linearly polarized laser light. The beam positioner can include at least one phase-shifting reflector arranged within a beam path along which light is propagatable from the first AOD. The at least one phase-shifting reflector can be configured and oriented to rotate the plane of polarization of light diffracted by the first AOD.

Another embodiment can be broadly characterized as a beam positioner that includes a first acousto-optic (AO) deflector (AOD), a second AOD and a phase retarder interposed between the first AOD and the second AOD. At least one AOD selected from the group consisting of the first AOD and the second AOD can include an AO cell formed of a material including germanium.

Another embodiment can be broadly characterized as a beam positioner that includes a first acousto-optic (AO) deflector (AOD), a second AOD arranged within a beam path along which a beam of laser light is propagatable from the first AOD, a phase retarder arranged within the beam path between the first AOD and the second AOD and a mirror arranged within the beam path between the first AOD and the second AOD. The first AOD, second AOD, phase retarder and mirror are arranged such that the beam of laser light is propagatable out of the second AOD in a direction that is at least generally opposite to a direction in which the beam of laser light is incident upon the first AOD.

DETAILED DESCRIPTION

Figure 1:
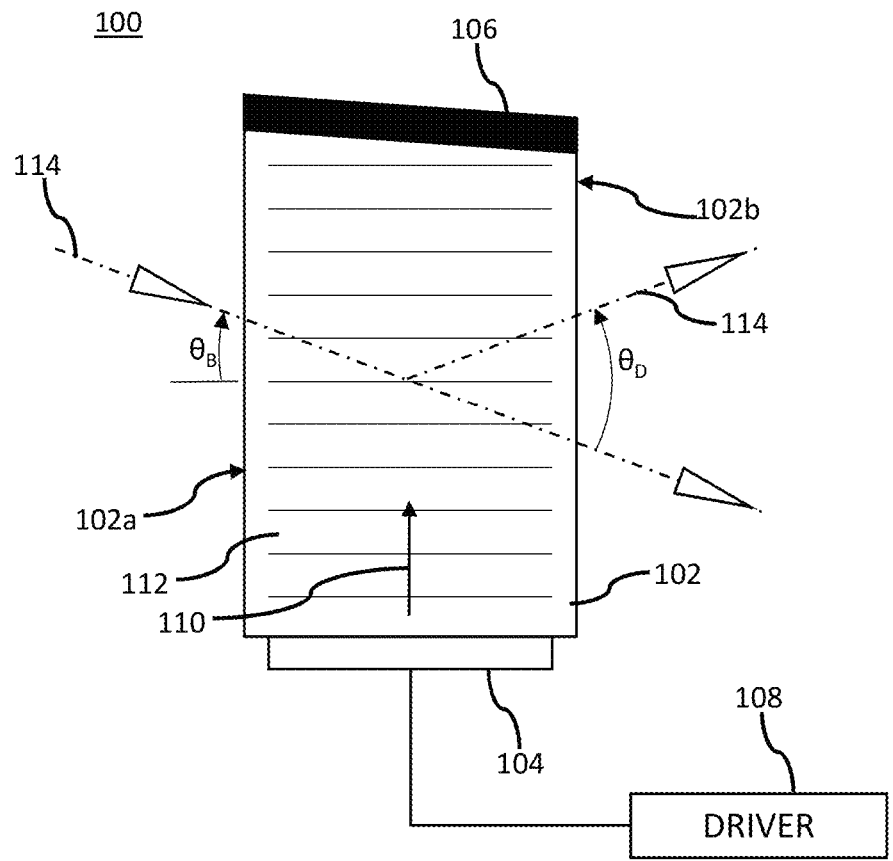
FIG. 1 schematically illustrates an acousto-optical deflector (AOD).
Figure 2:
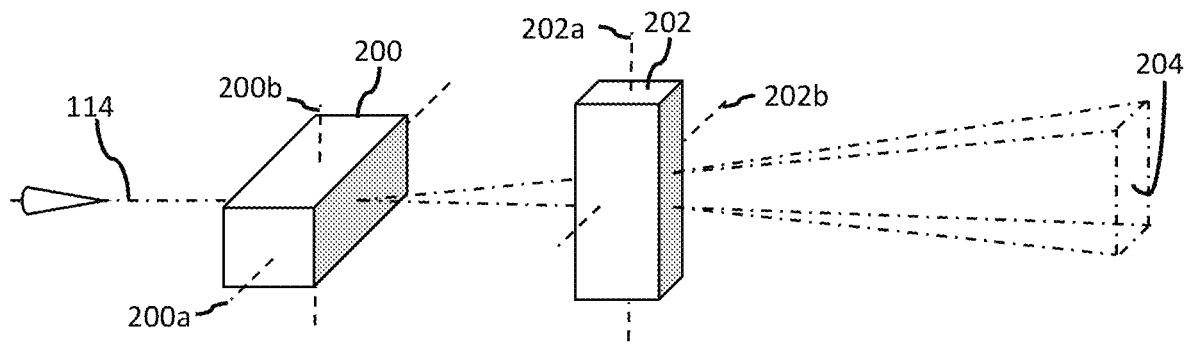
FIG. 2 schematically illustrates an arrangement of AODs in a multi-axis beam positioner.

Example embodiments are described herein with reference to the accompanying drawings. Unless otherwise expressly stated, in the drawings the sizes, positions, etc., of components, features, elements, etc., as well as any distances therebetween, are not necessarily to scale, but are exaggerated for clarity. In the drawings, like numbers refer to like elements throughout. Thus, the same or similar numbers may be described with reference to other drawings even if they are neither mentioned nor described in the corresponding drawing. Also, even elements that are not denoted by reference numbers may be described with reference to other drawings.

The terminology used herein is for the purpose of describing particular example embodiments only and is not intended to be limiting. Unless otherwise defined, all terms (including technical and scientific terms) used herein have the same meaning as commonly understood by one of ordinary skill in the art. As used herein, the singular forms "a," "an" and "the" are intended to include the plural forms as well, unless the context clearly indicates otherwise. It should be recognized that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Unless otherwise specified, a range of values, when recited, includes both the upper and lower limits of the range, as well as any sub-ranges therebetween. Unless indicated otherwise, terms such as "first," "second," etc., are only used to distinguish one element from another. For example, one node could be termed a "first node" and similarly, another node could be termed a "second node", or vice versa.

Unless indicated otherwise, the term "about," "thereabout," "approximately," etc., means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. Spatially relative terms, such as "below," "beneath," "lower," "above," and "upper," and the like, may be used herein for ease of description to describe one element or feature's relationship to another element or feature, as illustrated in the FIGS. It should be recognized that the spatially relative terms are intended to encompass different orientations in addition to the orientation depicted in the FIGS. For example, if an object in the FIGS. is turned over, elements described as "below" or "beneath" other elements or features would then be oriented "above" the other elements or features. Thus, the exemplary term "below" can encompass both an orientation of above and below. An object may be otherwise oriented (e.g., rotated 90 degrees or at other orientations) and the spatially relative descriptors used herein may be interpreted accordingly.

Embodiments of the present invention can be generally characterized as providing a multi-axis beam positioner including at least one phase-shifting reflector (also known in the art as a "phase shifting mirror," a "phase retarding mirror," a "reflective phase retarder," etc.) disposed in the path of the beam of laser light transmitted by an AOD. The beam of laser light transmitted by the AOD can be generally characterized as being linearly polarized, and the at least one phase-shifting reflector is configured and oriented so as to rotate the plane of polarization of the beam of laser light transmitted by the AOD.

Figure 3:
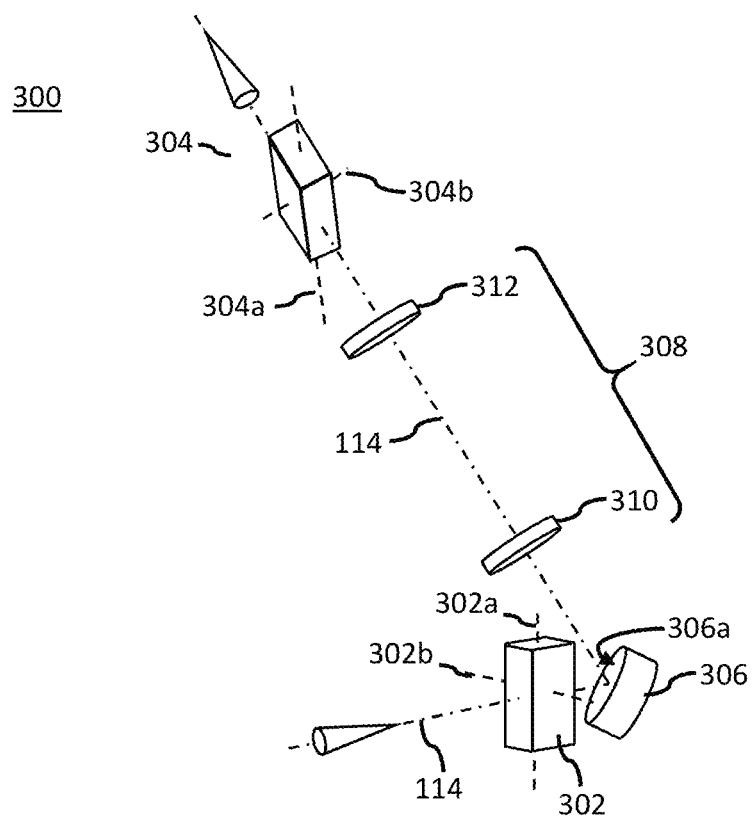
FIGS. 3, 4, 5 and 7 are perspective views schematically illustrating multi-axis beam positioners according to various embodiments.

In one example embodiment, shown in FIG. 3, a multi-axis beam positioner 300 may include a first AOD 302 (e.g., characterized by a first diffraction axis 302a and a first rotation axis 302b), a second AOD 304 (e.g., characterized by a second diffraction axis 304a and a second rotation axis 304b), a phase-shifting reflector 306, and an optical relay system 308 (e.g., comprising a pair of relay lenses 310 and 312). Generally, each of the first AOD 302 and the second AOD 304 may be provided as discussed above with respect to the AOD 100. For example, each of the first AOD 302 and the second AOD 304 may include an AO medium (such as AO medium 102), a transducer (such as transducer 104) attached to the transducer end of the AO medium and, optionally, an acoustic absorber (such as absorber 106) attached to the AO medium at an absorber end of the AO medium opposite the transducer end.

Although not illustrated, the multi-axis beam positioner 300 may include one or more RF drivers (e.g., such as RF driver 108) electrically coupled to an input of a transducer (also not shown) of each of the first AOD 302 and the second AOD 304. Accordingly, one or more drive signals can be applied to each of the first AOD 302 and the second AOD 304 by an RF driver. In response to an applied drive signal, the first AOD 302 is operative to deflect an incident beam of laser light within a first plane of deflection (i.e., a plane orthogonal to the first rotation axis 302b, and containing or otherwise parallel to the first diffraction axis 302a and the optical axis within the first AOD 302). Likewise, in response to an applied drive signal, the second AOD 304 is operative to deflect an incident beam of laser light within a second plane of deflection (i.e., a plane orthogonal to the second rotation axis 304b, and containing or otherwise parallel to the second diffraction axis 304a and the optical axis within the second AOD 304).

The half-wave phase-shifting reflector 306 is provided as a half-wave phase-shifting reflector (e.g., having a substantially planar reflector surface 306a) configured to effect a 180 degree phase shift between the S and P polarization components of the incident beam of laser light. The optical relay system 308 is arranged and configured to relay an image of the first AOD 302 onto the second AOD 304. As shown herein, the beam path 114 is graphically-illustrated as a dash-dot line, and the aforementioned components of the multi-axis beam positioner 300 are arranged so as to either diffract (e.g., in the case of the first AOD 302 and second AOD 304), refract (e.g., in the case of the optical relay system 308) or reflect (e.g., in the case of the half-wave phase-shifting reflector 306) laser light propagating along the beam path 114.

The first AOD 302 and the second AOD 304 are each provided as longitudinal-mode AODs. Accordingly, the plane of polarization of laser light incident upon any particular AOD is parallel to (or at least substantially parallel to) the plane of polarization of laser light that exits that AOD. The multi-axis beam positioner 300 is configured to operate on linearly polarized laser light and, so, laser light propagating along beam path 114 and incident upon the first AOD 302 is provided so as to be linearly polarized (or at least substantially linearly polarized) by any means known in the art, and the first AOD 302 is oriented such that the first diffraction axis 302a is parallel with (or at least substantially parallel with) the plane polarization of the beam of laser light incident thereto. Likewise, laser light propagating along beam path 114 and incident upon the second AOD 304 is linearly polarized (or at least substantially linearly polarized), and the second AOD 304 is oriented such that the second diffraction axis 304a is parallel with (or at least substantially parallel with) the plane polarization of the beam of laser light incident thereto.

The half-wave phase-shifting reflector 306 is arranged and configured to rotate the plane of polarization of laser light (i.e., relative to the first plane of deflection of the first AOD 302) that is incident upon the reflector surface 306a (i.e., after exiting the first AOD 302) by 90 degrees. To achieve this, and as will be discussed in greater detail below, the half-wave phase-shifting reflector 306 is oriented such that the beam of laser light is incident upon the reflector surface 306a at an angle of incidence of 45 degrees (or thereabout). In addition, the half-wave phase-shifting reflector 306 is oriented such that the plane of polarization of the incident beam of laser light is at an angle of 45 degrees (or at least substantially 45 degrees) relative to the plane of incidence/reflection at the reflector surface 306a.

During operation, the frequency contained in any drive signal to be applied to the first AOD 302 may be within an intended range of frequencies which, when applied to the first AOD 302, generate a first-order diffracted beam propagating exiting the first AOD 302 at a first-order deflection angle, $\theta_D$, that is within a range of first-order deflection angles (also referred to herein as the "first-order deflection angle range"). The intended frequency range can be conceptually considered as a frequency band spanning a range of frequencies that is bounded by a lower frequency an upper frequency.

In one embodiment, the orientation of the half-wave phase-shifting reflector 306 is fixed relative to the first AOD 302. Thus during operation of the first AOD 302, the first-order beam path 114 exiting the first AOD 302 may be incident upon the reflector surface 306a at one of many possible angles of incidence (i.e., depending upon the frequency contained in the drive signal applied to the first AOD 302 during operation of the first AOD 302). In one embodiment, the half-wave phase-shifting reflector 306 is oriented such that the first-order beam path 114 exiting the first AOD 302 is incident on the reflector surface 306a at an angle of incidence of 45 degrees (or thereabout, or otherwise at an angle of incidence of at least substantially 45 degrees) when the frequency of the drive signal applied to the first AOD 302 is equal to a reference frequency within the frequency band of the intended frequency range. The frequency band may be equal to 2 MHz, 5 MHz, 10 MHz, 15 MHz, 20 MHz, 25 MHz, 30 MHz, etc., or between any of these values, and the lower frequency of the frequency band may be equal to 25 MHz, 30 MHz, 35 MHz, 40 MHz, 45 MHz, 50 MHz, 55 MHz, 60 MHz, etc., or between any of these values. Accordingly, the reference frequency may be any frequency in a range from 26 MHz (or thereabout) to 89 MHz (or thereabout). In one embodiment, the reference frequency may be 30 MHz, 40 MHz, 50 MHz, 60 MHz, 70 MHz, 80 MHz, etc., or between any of these values. Generally, the reference frequency is located at or near the middle of the frequency band of the intended frequency range. In one embodiment, the reference frequency is near the middle of the frequency band of the intended frequency range when the reference frequency is within 15%, 10%, 5%, 2%, 1%, 0.5%, 0.25%, 0.1%, etc., or between any of these values, of the middle frequency in the frequency band.

In another embodiment, the orientation of the half-wave phase-shifting reflector 306 relative to the first AOD 302 can be variable. For example, the half-wave phase-shifting reflector 306 may be rotated to ensure that the first-order beam path 114 exiting the first AOD 302 is incident on the reflector surface 306a at an angle of incidence of 45 degrees (or thereabout, or otherwise at an angle of incidence of at least substantially 45 degrees) when the frequency of the drive signal applied to the first AOD 302 is within a sub-range of intended frequencies. The sub-range of intended frequencies can be considered as a frequency band spanning a sub-range of frequencies (which may be equal to or less than the intended frequency range) bounded by a lower frequency an upper frequency. To facilitate rapid adjustments in the orientation of the half-wave phase-shifting reflector 306 relative to the first AOD 302, the half-wave phase-shifting reflector 306 may be mounted to a stage that is actuated by a voice coil actuator, a piezoelectric-positioner, micro-electro-mechanical system (MEMS) positioner, or the like or any combination thereof), or the half-wave phase-shifting reflector 306 may be provided as a deformable mirror, or the like or any combination thereof.

As illustrated, the phase-shifting reflector 306 is disposed in the beam path 114 between the first AOD 302 and the optical relay system 308. In another embodiment, however, the phase-shifting reflector 306 can be disposed in the beam path 114 between the pair of relay lenses 310 and 312 of the optical relay system 308. In yet another embodiment, the phase-shifting reflector 306 can be disposed in the beam path 114 between the optical relay system 308 and the second AOD 304.

When oriented and configured as described above, the half-wave phase-shifting reflector 306 rotates the plane of polarization of an incident beam of laser light (i.e., about the optical axis along which the beam of laser light propagates) by 90 degrees with respect to the first plane of deflection of the first AOD 302. Further, and as exemplarily illustrated in FIG. 3, the half-wave phase-shifting reflector 306 skews an orientation of the beam path 114 in a manner that can make it difficult to assemble the components of the multi-axis beam positioner 300 into a relatively compact package. To facilitate a more-compact assembly of the multi-axis beam positioner 300, a mirror configured to impart zero (or at least substantially zero) phase shift (also referred to herein as a "zero phase-shift reflector") can be provided to fold the beam path 114 in any suitable or desired manner to provide a more-compact multi-axis beam positioner.

Figure 4:
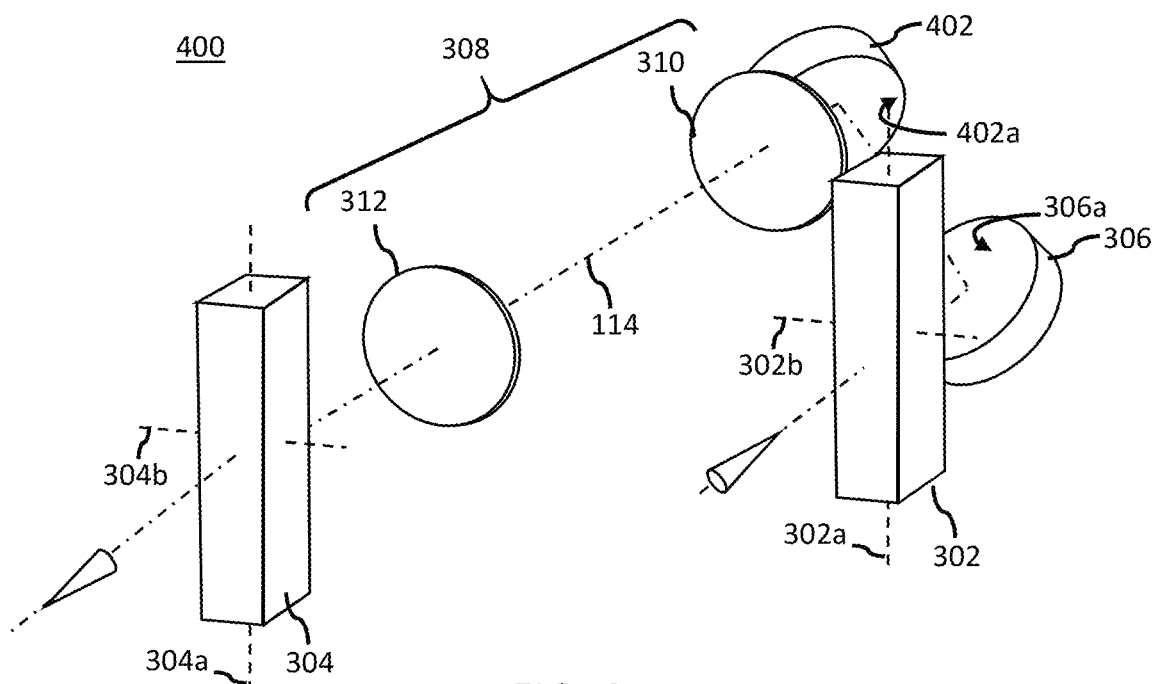

For example, and with reference to FIG. 4, a zero phase-shift reflector 402 (e.g., having a substantially planar reflector surface 402a) may be inserted into the beam path 114 between the half-wave phase-shifting reflector 306 and lens 310 of the multi-axis beam positioner 300 (thereby yielding multi-axis beam positioner 400). As exemplarily shown in FIG. 4, the zero phase-shift reflector 402 can be oriented such that the beam of laser light reflected by the zero phase-shift reflector 402 propagates along a direction that is generally opposite to the direction in which the beam of laser light propagates on incidence to the half-wave phase-shifting reflector 306 and such that the first plane of deflection of the first AOD 302, as reflected from the zero phase-shift reflector 402, is rotated by 90 degrees relative to the orientation of the first plane of deflection as incident upon the reflector surface 306a. Because the zero phase-shift reflector 402 does not impart any (or any substantial) phase shift, the plane of polarization of beam of laser light reflected at the reflector surface 402a does not change (or changes a negligible amount) relative to the first plane of deflection of the first AOD 302. As a result, the direction of polarization of the linearly-polarized laser light ultimately delivered to the second AOD 304 will be parallel to (or at least substantially parallel to) the direction of polarization of the linearly-polarized laser light output from the first AOD 302. Thus, as illustrated in FIG. 4, the second diffraction axis 304a of the second AOD 304 can be parallel to (or at least substantially parallel to) the first diffraction axis 302a of the first AOD 302. Further, the first plane of deflection of the first AOD 302, as it is projected onto the second AOD 304 (e.g., from the zero phase-shift reflector 402 via the optical relay system 308), will be perpendicular to (or at least substantially perpendicular to) the second plane of deflection of the second AOD 304. Thus the scan field associated with the first AOD 302 (a one-dimensional scan field), as it is projected onto the second AOD 304, will be perpendicular to (or at least substantially perpendicular to) the scan field associated with the second AOD 304 (also a one-dimensional scan field), and the multi-axis beam positioner 400 can be considered as having a two-dimensional scan field characterized by the superposition of the two, one-dimensional scan fields associated with the first AOD 302 and the second AOD 304.

Typically, the amount of phase shift (also known as "phase retardation") that the half-wave phase-shifting reflector 306 can impart to an incident beam of laser light propagating along the beam path 114 will change as the angle of incidence of the beam path 114 at the reflector surface 306a changes (e.g., as a result of changing the drive frequency of the first AOD 302). This change in phase shift would result in a deviation of the polarization state of the beam that is incident upon the second AOD 304 such that it is no longer linearly polarized in the desired axis, but rather is elliptically polarized. To eliminate or otherwise reduce the effect of a variable angle of incidence of the beam path 114 at the reflector surface 306a, the half-wave phase-shifting reflector 306 may be replaced with a pair of quarter-wave phase-shifting reflectors. For example, and as shown in FIG. 5, a multi-axis beam positioner 500 may be provided as similarly described with respect to the multi-axis beam positioner 300 shown in FIG. 3, but the half-wave phase-shifting reflector 306 is replaced by a pair of quarter-wave phase-shifting reflectors (i.e., a first phase-shifting reflector 502 having a substantially planar reflector surface 502a and a second phase-shifting reflector 504 having a substantially planar reflector surface 504a) arranged within the beam path 114.

Figure 5:
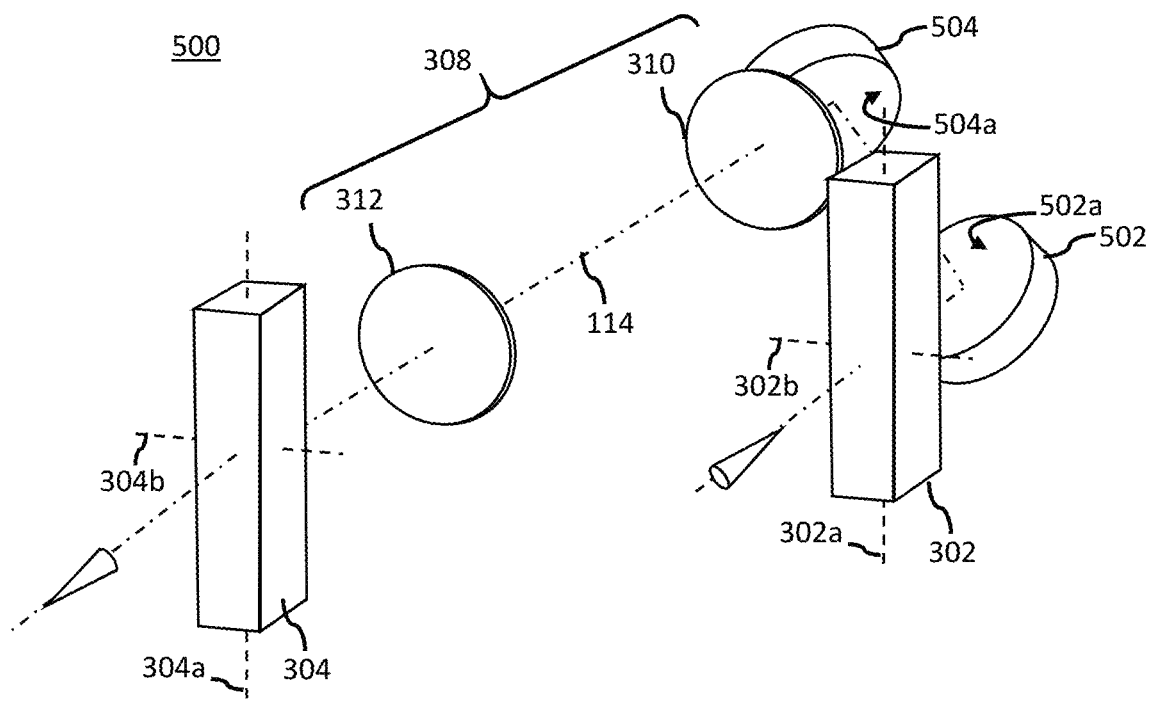

As exemplarily shown in FIG. 5, the first quarter-wave phase-shifting reflector 502 is oriented such that a beam of laser light propagating along beam path 114 will be incident upon the reflector surface 502a at an angle of incidence (also referred to as a "first angle of incidence") of 45 degrees (or thereabout, or otherwise at a first angle of incidence of at least substantially 45 degrees) when the frequency of the drive signal applied to the first AOD 302 is equal to the aforementioned reference frequency of the intended frequency range. The first quarter-wave phase-shifting reflector 502 is further oriented to ensure that the light reflected from the reflector surface 502a contains equal (or at least substantially equal) amounts of S and P polarization components (i.e., so that the light reflected by the reflector surface 502a is circularly-polarized, or at least roughly circularly-polarized) when the frequency of the drive signal applied to the first AOD 302 is equal to the aforementioned reference frequency of the intended frequency range. When oriented as described above, the first quarter-wave phase-shifting reflector 502 is thus configured to effect a phase shift between the S and P polarized components of an incident beam of laser light by 90 degrees (or thereabout).

The second quarter-wave phase-shifting reflector 504 is oriented such that the reflector surface 504a is perpendicular to (or at least substantially perpendicular to) the reflector surface 502a of the first quarter-wave phase-shifting reflector 502. Thus, the surface normal of the reflector surface 504a of the second quarter-wave phase-shifting reflector 504 is perpendicular to (or at least substantially perpendicular to) the surface normal of the reflector surface 502a of the first quarter-wave phase-shifting reflector 502. When oriented as described above, the second quarter-wave phase-shifting reflector 504 is configured to effect a phase shift between the S and P polarized components of an incident beam of laser light by 90 degrees (or thereabout). Accordingly, circularly-polarized (or at least roughly circularly-polarized) light that is incident upon the reflector surface 504a will be reflected as linearly-polarized (or at least substantially linearly-polarized) light.

Figure 6:
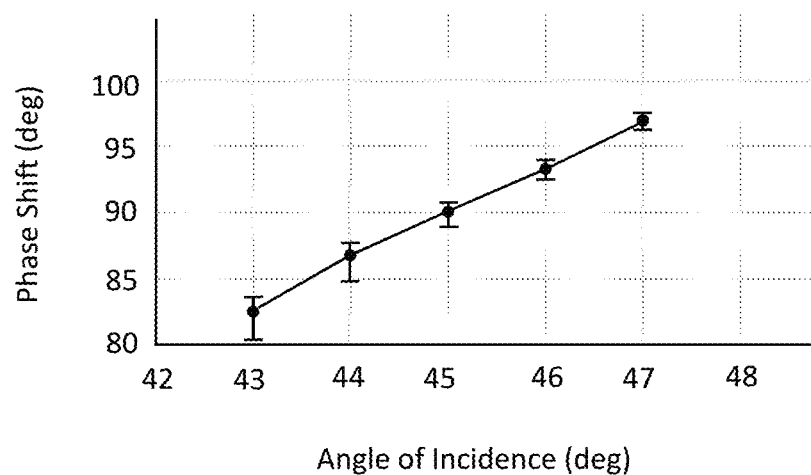
FIGS. 6 and 8 are graphs illustrating exemplary relationships between phase shift and angle of incidence for quarter-wave phase-shifting reflectors in multi-axis beam positioners according to various embodiments.

To facilitate a combined phase shift of 180 degrees (or thereabout) from the pair of quarter-wave phase-shifting reflectors 502 and 504 in the multi-axis beam positioner 500, the first quarter-wave phase-shifting reflector 502 is provided to have the same (or substantially the same) phase-shifting characteristics (which may be at least substantially linear) as the second quarter-wave phase-shifting reflector 504 over the same range of angles of incidence. FIG. 6 is a chart illustrating exemplary phase-shifting characteristics that each of the first quarter-wave phase-shifting reflector 502 and the second quarter-wave phase-shifting reflector 504 may have over the same range of angles of incidence. The amount of phase shift imparted by either the first quarter-wave phase-shifting reflector 502 or the second quarter-wave phase-shifting reflector 504 at any particular angle of incidence has the potential to vary (e.g., as indicated by the error bars) depending upon one or more factors such as the material from which the reflector surface of the quarter-wave phase-shifting reflector is made, the temperature of the reflector surface, the presence, magnitude and orientation of any mechanical strain at the reflector surface, or the like or any combination thereof.

When the first-order beam path 114 exiting the first AOD 302 is incident on the reflector surface 502a at a first angle of incidence of 45 degrees, the first quarter-wave phase-shifting reflector 502 will impart a 90 degree phase shift to the linearly polarized laser light incident thereupon, and reflect a beam of laser light that is at least substantially circularly polarized (e.g., with at least substantially equal amounts of S and P polarization components). However, and as exemplarily shown in FIG. 6, when the first angle of incidence deviates away from 45 degrees, the phase shift imparted by the first quarter-wave phase-shifting reflector 502 correspondingly deviates away from 90 degrees, resulting in a reflected beam of laser light having a polarization that becomes increasingly elliptical.

For example, as the first angle of incidence increases above 45 degrees, the first quarter-wave phase-shifting reflector 502 will produce a phase shift greater than 90 degrees (i.e., an "overshift"). As the angle of incidence decreases below 45 degrees, the first quarter-wave phase-shifting reflector 502 will produce a phase shift less than 90 degrees (i.e., an "undershift"). However, when the second quarter-wave phase-shifting reflector 504 is oriented as described above, a second angle of incidence (i.e., the angle of incidence of the beam of laser light incident upon the reflector surface 504a) is a complement to the first angle of incidence. That is, the sum of the first and second angles of incidence is 90 degrees. Accordingly, an overshift produced by the first quarter-wave phase-shifting reflector 502 is compensated for by an equal (or approximately or at least substantially equal) but opposite undershift produced by the second quarter-wave phase-shifting reflector 504. Likewise, an undershift produced by the first quarter-wave phase-shifting reflector 502 is compensated for by an equal (or approximately or at least substantially equal) but opposite overshift produced by the second quarter-wave phase-shifting reflector 504. The net result is that the first quarter-wave phase-shifting reflector 502 and second quarter-wave phase-shifting reflector 504, together, can effect a combined phase shift of 180 degrees (or thereabout) between the S and P components in the beam of laser light that is incident upon the first quarter-wave phase-shifting reflector 502 over a range of angles of incidence.

When oriented and configured as described above, the first quarter-wave phase-shifting reflector 502 and second quarter-wave phase-shifting reflector 504 of the multi-axis beam positioner 500 act together to rotate the plane of polarization of the beam of laser light output from the first AOD 302 (e.g., by 90 degrees, or thereabout) relative to the first plane of deflection of the first AOD 302, and to also rotate the first plane of deflection of the first AOD 302 (e.g., by 90 degrees, or thereabout) relative to the orientation of the first plane of deflection as incident upon the reflector surface 502a, and the multi-axis beam positioner 500 can thus be considered as having a two-dimensional scan field characterized by the superposition of the two, one-dimensional scan fields associated with the first AOD 302 and the second AOD 304.

As illustrated in FIG. 5, the first quarter-wave phase-shifting reflector 502 and second quarter-wave phase-shifting reflector 504 are disposed between the first AOD 302 and the optical relay system 308. In another embodiment, however, the first quarter-wave phase-shifting reflector 502 and second quarter-wave phase-shifting reflector 504 can be disposed between the pair of relay lenses 310 and 312 of the optical relay system. In yet another embodiment, the first quarter-wave phase-shifting reflector 502 and second quarter-wave phase-shifting reflector 504 can be disposed between the optical relay system 308 and the second AOD 302. In yet another embodiment, the first quarter-wave phase-shifting reflector 502 can be disposed between any pair of the components in the multi-axis beam positioner 500 and the second quarter-wave phase-shifting reflector 504 can be disposed optically downstream of the first quarter-wave phase-shifting reflector 502, between another pair of the components in the multi-axis beam positioner 500.

Figure 7:
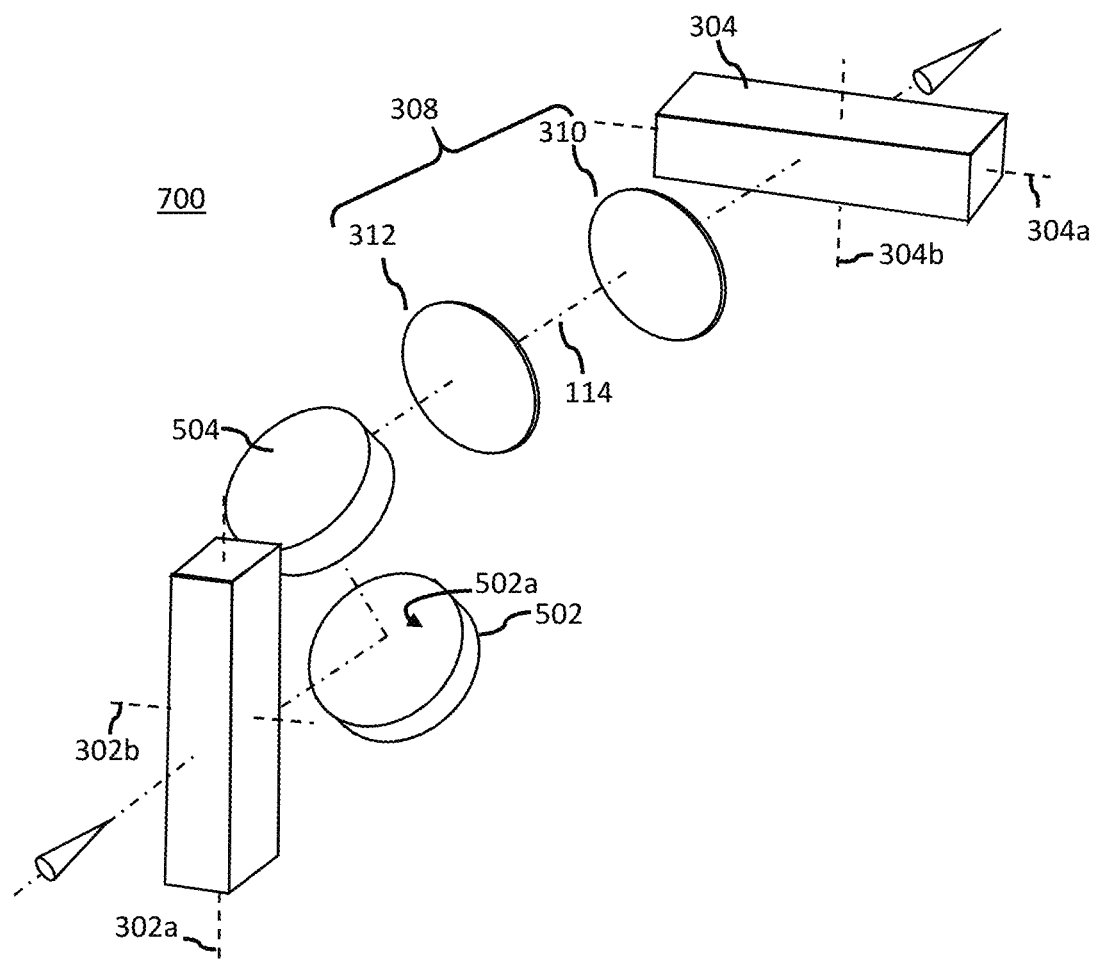

In another embodiment, the multi-axis beam positioner 500 can be modified such that the reflector surface 504a of the second quarter-wave phase-shifting reflector 504 is parallel to (or at least substantially parallel to) the reflector surface 502a of the first quarter-wave phase-shifting reflector 502 (thereby yielding the multi-axis beam positioner 700 shown in FIG. 7). In addition to the reflector surfaces 502a and 504a being parallel to (or at least substantially parallel to) one another, the plane of reflection of the second quarter-wave phase-shifting reflector 504 is the same (or at least substantially coplanar as) the plane of reflection of the first quarter-wave phase-shifting reflector 502. Thus, the surface normal of the reflector surface 504a of the second quarter-wave phase-shifting reflector 504 would be parallel to (or at least substantially parallel to) the surface normal of the reflector surface 502a of the first quarter-wave phase-shifting reflector 502.

Figure 8:
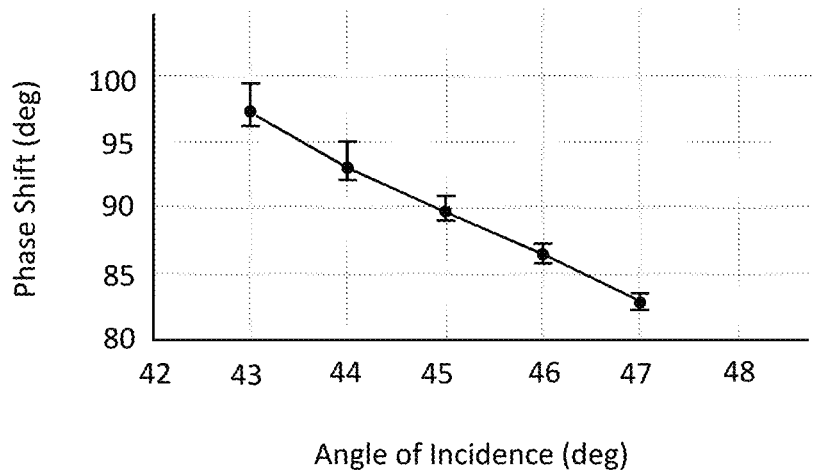

To facilitate a combined phase shift of 180 degrees (or about 180 degrees) from the pair of quarter-wave phase-shifting reflectors 502 and 504 in the multi-axis beam positioner 700, the first quarter-wave phase-shifting reflector 502 is provided to have correspondingly different phase-shifting characteristics (which may be at least substantially linear) as the second quarter-wave phase-shifting reflector 504 over the same range of angles of incidence. Specifically, one of the first quarter-wave phase-shifting reflector 502 or the second quarter-wave phase-shifting reflector 504 is configured to produce an undershift of phase between S and P polarization components at a given angle of incidence (by any suitable or beneficial means known in the art) while the other of the first quarter-wave phase-shifting reflector 502 or the second quarter-wave phase-shifting reflector 504 is configured to produce an overshift of phase between S and P polarizations at the same given angle of incidence. FIG. 8 is a chart illustrating exemplary phase-shifting characteristics that one of the first quarter-wave phase-shifting reflector 502 or the second quarter-wave phase-shifting reflector 504 may have over a range of angles of incidence. For example, the first quarter-wave phase-shifting reflector 502 may have the phase-shifting characteristics shown in FIG. 6 while the second quarter-wave phase-shifting reflector 504 may have the phase-shifting characteristics shown in FIG. 8, or vice-versa.

As shown in FIGS. 6 and 8, the combined magnitude of the undershift and overshift at a common angle of incidence will be 180 degrees (or thereabout). For example, at an angle of incidence of 45 degrees, both of the quarter-wave phase-shifting reflectors produce a 90 degree phase shift. At an angle of incidence of 43 degrees, one of the quarter-wave phase-shifting reflectors produces an 83 degree phase shift (see FIG. 6) while the other of the quarter-wave phase-shifting reflectors produces a 97 degree phase shift (see FIG. 8). At an angle of incidence of 46 degrees, one of the quarter-wave phase-shifting reflectors produces a phase shift of 94 degrees (see FIG. 6) while the other of the quarter-wave phase-shifting reflectors produces a phase shift of 86 degrees (see FIG. 8).

When oriented and configured as described above, the first quarter-wave phase-shifting reflector 502 and second quarter-wave phase-shifting reflector 504 of the multi-axis beam positioner 700 act together to rotate the plane of polarization of the beam of laser light output from the first AOD 302 (e.g., by 90 degrees, or thereabout) relative to the first plane of deflection of the first AOD 302. Unlike the embodiment discussed above with respect to the multi-axis beam positioner 500, however, the pair of quarter-wave phase-shifting reflectors in the multi-axis beam positioner 700 do not rotate the first plane of deflection of the first AOD 302 relative to the plane of polarization of laser light incident upon the reflector surface 502a of the first quarter-wave phase-shifting reflector 502. The pair of quarter-wave phase-shifting reflectors can also be considered to redirect the beam path 114 such that light reflected from the reflector surface 504a propagates in a direction that is generally the same as the direction in which the beam of laser light was incident upon the reflector surface 502a of the first quarter-wave phase-shifting reflector 502. As a result, the direction of polarization of the linearly-polarized laser light ultimately delivered to the second AOD 304 in the multi-axis beam positioner 700 will be perpendicular to (or at least substantially perpendicular to) the direction of polarization of the linearly-polarized laser light output from the first AOD 302. Thus, as illustrated in FIG. 7, the second diffraction axis 304a of the second AOD 304 can be perpendicular to (or at least substantially perpendicular to) the first diffraction axis 302a of the first AOD 302. Further, the first plane of deflection of the first AOD 302, as it is projected onto the second AOD 304 (e.g., from the second quarter-wave phase-shifting reflector 504 via the optical relay system 308), will be perpendicular to (or at least substantially perpendicular to) the second plane of deflection of the second AOD 304. Thus the scan field associated with the first AOD 302 (a one-dimensional scan field), as it is projected onto the second AOD 304, will be perpendicular to (or at least substantially perpendicular to) the scan field associated with the second AOD 304 (also a one-dimensional scan field), and the multi-axis beam positioner 700 can be considered as having a two-dimensional scan field characterized by the superposition of the two, one-dimensional scan fields associated with the first AOD 302 and the second AOD 304.

From the discussion above it is assumed that, in the multi-axis beam positioner 700, the orientation of the first quarter-wave phase-shifting reflector 502 is fixed relative to the first AOD 302 and that the orientation of the second quarter-wave phase-shifting reflector 504 is fixed relative to the first quarter-wave phase-shifting reflector 502. In this embodiment, and unlike the embodiment discussed with respect to FIG. 5, the second quarter-wave phase-shifting reflector 504 does not compensate for overshift or undershift if the two phase-shifting reflectors impart the same phase shift between S and P polarization components at an angle of incidence other than an angle of incidence that imparts a 90 degree phase shift between the S and P polarization components. However, in other embodiments, the orientation of the first quarter-wave phase-shifting reflector 502 relative to the first AOD 302 can be variable, the orientation of the second quarter-wave phase-shifting reflector 504 relative to the first AOD 302 can be variable, the orientation of the first quarter-wave phase-shifting reflector 502 relative to the second quarter-wave phase-shifting reflector 504 can be variable, the orientation of the second quarter-wave phase-shifting reflector 504 relative to the first quarter-wave phase-shifting reflector 502 can be variable, or the like or any combination thereof. For example, the first quarter-wave phase-shifting reflector 502 may be rotated (e.g., independently of, or in unison with, the second quarter-wave phase-shifting reflector 504) to ensure that the first-order beam path 114 exiting the first AOD 302 is incident on the reflector surface 502a at an angle of incidence of 45 degrees (or at least substantially 45 degrees) when the frequency of the drive signal applied to the first AOD 302 is within the aforementioned sub-range of intended frequencies. In another example, the second quarter-wave phase-shifting reflector 504 may be rotated relative to the first quarter-wave phase-shifting reflector 502 to compensate for any overshift or undershift produced by the first quarter-wave phase-shifting reflector 502 when the frequency of the drive signal applied to the first AOD 302 is within the aforementioned sub-range of intended frequencies. To facilitate rapid adjustments in the orientation of any of the quarter-wave phase-shifting reflectors, one or both of the quarter-wave phase-shifting reflectors may be mounted to a stage that is actuated by a voice coil actuator, a piezoelectric-positioner, micro-electro-mechanical system (MEMS) positioner, or the like or any combination thereof), or one or both of the quarter-wave phase-shifting reflectors may be provided as a deformable mirror, or the like or any combination thereof.

In one embodiment, the material from which the AO medium 102 of the first and second AODs 302 and 304 is formed can be a material such as germanium (Ge), which is typically selected to deflect light having a wavelength in a range from 2 µm to 20 µm. Accordingly the beam of laser light propagating along the beam path 114 can have a wavelength in a range from 2 µm to 20 µm and, in one embodiment, the wavelength is in a range from 9 µm to 11 µm. Exemplary wavelengths can include 9.4 µm, 9.6 µm, 10.6 µm, etc., or thereabout or between any of these values. Such a beam of laser light can be generated from any suitable laser source (e.g., a high-power $CO_2$ laser, capable of outputting a laser beam at an average power in a range from 20 W (or thereabout) to 20 kW (or thereabout), as is known in the art). The material from which any of the aforementioned phase-shifting reflectors can be formed can include a material such as silicon, copper, molybdenum, gold, or the like or any combination thereof, and as is known in the art, is typically selected depending on the wavelength of light in the beam of laser light to be deflected. For example, the AO cells of the first and second AODs 302 and 304 may be formed of germanium (Ge) and any phase-shifting reflector of any of the multi-axis beam positioners 300, 400, 500 or 700 may be formed of a material such as silicon or copper, and may optionally include one more coatings as is well known in the art.

In the embodiments discussed above, the multi-axis beam positioners 300, 400, 500 and 700 are provided as multi-axis beam positioners with two AODs (i.e., the first and second AODs 200 and 202). In other embodiments, the beam positioner may include a single AOD, or more than two AODs. In an embodiment in which the beam positioner includes a single AOD, the beam positioner may include at least one phase-shifting reflector (e.g., at least one half-wave phase-shifting reflector, at least one quarter-wave phase-shifting reflector, or the like or any combination thereof) arranged at the optical output of the AOD. In an embodiment in which the beam positioner includes more than two AODs, the beam positioner may or may not include at least one phase-shifting reflector (e.g., as described above with respect to any of FIG. 3, 4, 5 or 7) arranged at the optical output of any AOD from which a beam path is fed into another AOD.

In the embodiments discussed above, the beam positioner is described as including, as beam deflecting devices, one or more AODs. It should be recognized that the beam positioner may additionally include one or more other beam deflecting devices (e.g., arranged so as to deflect any beam of light transmitted by any of the AODs described above). In such a case, any of such other beam deflecting devices may include an electro-optic deflector (EOD), a fast-steering mirror (FSM) element actuated by a piezoelectric actuator, electrostrictive actuator, voice-coil actuator, etc., a galvanometer mirror, a rotating polygon mirror scanner, etc., or the like or any combination thereof.

The foregoing is illustrative of embodiments and examples of the invention, and is not to be construed as limiting thereof. Although a few specific embodiments and examples have been described with reference to the drawings, those skilled in the art will readily appreciate that many modifications to the disclosed embodiments and examples, as well as other embodiments, are possible without materially departing from the novel teachings and advantages of the invention.

For example, although the embodiments presented above have discussed the use of either a half-wave phase-shifting reflector or a pair of quarter-wave phase-shifting reflectors to effect rotation of the plane of polarization of light output from the first AOD 302, it will be appreciated that any other type of phase-shifting reflector, or combination of phase-shifting reflectors may be used (with or without cooperative of one or more zero phase-shifting reflectors), provided that such reflectors are configured and oriented to impart a 180 degree (or thereabout) phase shift between the S and P components of polarized light in the beam of laser light propagating along beam path 114 so as to rotate the plane of polarization of light output from the first AOD 302 by 90 degrees (or thereabout) relative to the first plane of deflection of the first AOD 302.

Further, although the discussion above regarding the material from which the AO medium 102 of the first and second AODs 200 and 202 is formed has been limited to germanium, it will be appreciated that the material from which the AO medium 102 of any of the first and second AODs 200 and 202 can be any other suitable material such as gallium arsenide (GaAs), wulfenite ($PbMoO_4$), tellurium dioxide ($TeO_2$), crystalline quartz, glassy $SiO_2$, arsenic trisulfide ($As_2S_3$), $LiNbO_3$, or the like, and as is known in the art, is typically selected depending on the wavelength of light in the beam of laser light to be deflected. Thus, the materials from which the aforementioned phase-shifting reflectors can be formed will also depend, as is known in the art, upon the wavelength of light in the beam of laser light to be reflected. Exemplary materials from which any phase-shifting reflector can be formed can include a material such as glass, fused silica, crystal quartz, silicon, copper, molybdenum, gold, silicon carbide, aluminum, or the like or any combination thereof.

Further, although the embodiments presented above have discussed the use and arrangement of AODs having a diffraction axis that is parallel to (or at least substantially parallel to) the plane of polarization of the beam of laser light incident thereto, the principles discussed herein may be applied to other embodiments involving the use of AODs having a diffraction axis that is perpendicular to (or at least substantially perpendicular to) the plane of polarization of the beam of laser light incident thereto. For example, each of the first AOD 302 and the second AOD 304 (i.e., in any of the multi-axis beam positioners 300, 400, 500 or 700) can be provided with an AO cell formed of a material such as crystalline quartz, and be oriented such that the diffraction axis of each of these AODs is perpendicular to (or at least substantially perpendicular to) the plane of polarization of the beam of laser light incident to each AOD as the beam of laser light propagates along beam path 114. In this example, the beam of laser light has a wavelength in the ultraviolet, visible or other infrared ranges of the electromagnetic spectrum, and is linearly polarized.

Further, although the embodiments presented above have described the multi-axis beam positioners 300, 400, 500 or 700 as including an optical relay system 308, it will be appreciated that the optical relay system 308 may be omitted.

Further, although embodiments have been discussed above in which phase-shifting reflectors are variously used impart a phase shift to the beam of laser light output from the first AOD 302, it will be appreciated that one or more transmissive phase-shifting plates may also be used (e.g., in addition to, or as an alternative to, any of the phase-shifting reflectors discussed above with respect to any of FIG. 3, 4, 5 or 7). Generally, the transmissive phase-shifting plate is at least substantially transparent to the wavelength of the beam of laser light that will propagate along the beam path 114. For example, a transmissive phase-shifting plate, such as a structured-diamond half-wave plate, may be inserted into the beam path 114 to impart a 180 phase shift to the beam of laser light output by the first AOD 302 when the beam of laser light propagating along the beam path 114 has a wavelength in a range from 9 μm to 11 μm (e.g., 9.4 μm, 9.6 μm, 10.6 μm, etc., or thereabout or between any of these values).

Accordingly, all such modifications are intended to be included within the scope of the invention as defined in the claims. For example, skilled persons will appreciate that the subject matter of any sentence, paragraph, example or embodiment can be combined with subject matter of some or all of the other sentences, paragraphs, examples or embodiments, except where such combinations are mutually exclusive. The scope of the present invention should, therefore, be determined by the following claims, with equivalents of the claims to be included therein.

What is claimed is:

1. A beam positioner for deflecting a beam path, along which a diffracted beam of linearly polarized laser light is propagatable, within a two-dimensional scan field, the beam positioner comprising:
   a first acousto-optic (AO) deflector (AOD) operative to diffract the laser light so as to deflect the beam path within a first one-dimensional scan field extending along a first axis of the two-dimensional scan field;
   a second AOD operative to diffract the laser light so as to deflect the beam path within a second one-dimensional scan field extending along a second axis of the two-dimensional scan field; and
   at least one phase-shifting reflector arranged between the first AOD and the second AOD and within the beam path along which the beam of laser light is propagatable from the first AOD, wherein the at least one phase-shifting reflector is operative to effect a phase shift between S and P components in the beam of laser light incident thereupon,
   wherein the first AOD, the second AOD and the at least one phase-shifting reflector are arranged such that the first one-dimensional scan field is incident upon the at least one phase-shifting reflector, and such that the first one-dimensional scan field is projectable onto the second AOD from the at least one phase-shifting reflector in a manner that the first axis of the first one-dimensional scan field is not parallel to the second axis of the second one-dimensional scan field,
   wherein each of the first AOD and the second AOD is configured and operative to deflect the beam path along only one axis of the two-dimensional scan field.

2. The beam positioner of claim 1, wherein
the at least one phase-shifting reflector is configured and oriented to rotate a plane of polarization of the laser light diffracted by the first AOD such that the plane of polarization of the laser light diffracted by the first AOD, as projected onto the second AOD, is parallel to the second one-dimensional scan field.

3. The beam positioner of claim 1, wherein
the second AOD has a second diffraction axis, and
the at least one phase-shifting reflector is configured and oriented to rotate a plane of polarization of the laser light diffracted by the first AOD such that the plane of polarization of the laser light diffracted by the first AOD, as projected onto the second AOD, is perpendicular to the second diffraction axis one-dimensional scan field.

4. The beam positioner of claim 1, wherein the at least one phase-shifting reflector includes a half-wave phase-shifting reflector.

5. The beam positioner of claim 1, wherein the at least one phase-shifting reflector includes two quarter-wave phase-shifting reflectors.

6. The beam positioner of claim 5, wherein the two quarter-wave phase-shifting reflectors includes:
   a first quarter-wave phase-shifting reflector having a first reflector surface; and a
   a second quarter-wave phase-shifting reflector having a second reflector surface,
   wherein the first quarter-wave phase-shifting reflector and the second quarter-wave phase-shifting reflector are oriented relative to one another such that a surface normal of the first reflector surface is perpendicular to a surface normal of the second reflector surface.

7. The beam positioner of claim 5, wherein the two quarter-wave phase-shifting reflectors includes:
   a first quarter-wave phase-shifting reflector having a first reflector surface; and a
   a second quarter-wave phase-shifting reflector having a second reflector surface,
   wherein the first quarter-wave phase-shifting reflector and the second quarter-wave phase-shifting reflector are oriented relative to one another such that a surface normal of the first reflector surface is parallel to a surface normal of the second reflector surface.

8. The beam positioner of claim 1, further comprising at least one galvanometer mirror arranged within the beam path, wherein the at least one phase-shifting reflector is arranged between the first AOD and the galvanometer mirror.

9. The beam positioner of claim 1, wherein the orientation of the at least one phase-shifting reflector is fixed relative to the first AOD.

10. The beam positioner of claim 1, wherein the orientation of the at least one phase-shifting reflector is variable relative to the first AOD.

11. The beam positioner of claim 1, wherein the first AOD includes an AO cell formed of a material including germanium.

12. The beam positioner of claim 1, wherein the first AOD includes an AO cell formed of a material including quartz.

13. The beam positioner of claim 1, wherein the at least one phase-shifting reflector is formed of a material including at least one material selected from the group consisting of silicon and copper.

14. The beam positioner of claim 1, wherein the first one-dimensional scan field is projectable onto the second AOD in a manner that the first axis of the first one-dimensional scan field is perpendicular to the second axis of the second one-dimensional scan field.

15. The beam positioner of claim 1, further comprising an optical relay system arranged between the first AOD and the second AOD such that the first one-dimensional scan field is projectable onto the second AOD via the optical relay system.

16. The beam positioner of claim 15, wherein the at least one phase-shifting reflector is arranged between the first AOD and the optical relay system.

17. The beam positioner of claim 15, wherein the at least one phase-shifting reflector is arranged between the second AOD and the optical relay system.

18. The beam positioner of claim 15, wherein the optical relay system includes a pair of lenses and wherein the at least one phase-shifting reflector is arranged between the lenses of the pair of lenses.

* * * * *